United States Patent
Chen et al.

(10) Patent No.: US 7,382,091 B2
(45) Date of Patent: Jun. 3, 2008

(54) WHITE LIGHT EMITTING DIODE USING PHOSPHOR EXCITATION

(76) Inventors: Lung-Chien Chen, 3F, No. 66, Luang-An Rd., Hsin-Chuang City, Taipei Hsien (TW); Wen-How Lan, No. 9, Lane 33, Tai-Chang 1st St., Taoyuan City, Taoyuan Hsien (TW); Feng-Ku Chien, No. 273, Lien-Cheng Rd., Chung-Ho City, Taipei Hsien (TW)

( * ) Notice: Subject to any disclaimer, the term of this patent is extended or adjusted under 35 U.S.C. 154(b) by 545 days.

(21) Appl. No.: 11/190,990

(22) Filed: Jul. 27, 2005

(65) Prior Publication Data

US 2007/0024191 A1 Feb. 1, 2007

(51) Int. Cl.
*H01J 1/62* (2006.01)
*F21V 9/00* (2006.01)

(52) U.S. Cl. .................. 313/512; 313/113; 313/114; 362/260; 362/296; 362/297; 362/310; 362/311; 362/341; 362/351

(58) Field of Classification Search ............... 313/512, 313/113, 114; 362/235, 241, 242, 243, 247, 362/307, 260, 296, 297, 300, 310, 311, 341, 362/349, 351
See application file for complete search history.

(56) References Cited

U.S. PATENT DOCUMENTS

| 5,813,753 | A | * | 9/1998 | Vriens et al. ............... 362/293 |
| 5,962,971 | A | | 10/1999 | Chen ........................... 313/512 |
| 6,833,565 | B2 | | 12/2004 | Su et al. ....................... 257/98 |
| 7,048,385 | B2 | * | 5/2006 | Beeson et al. ................. 353/97 |
| 7,319,289 | B2 | * | 1/2008 | Suehiro et al. ............. 313/485 |
| 2004/0145289 | A1 | * | 7/2004 | Ouderkirk et al. .......... 313/113 |
| 2006/0072314 | A1 | * | 4/2006 | Rains .......................... 362/231 |
| 2007/0024191 | A1 | * | 2/2007 | Chen et al. ................. 313/512 |

* cited by examiner

*Primary Examiner*—Ashok Patel

(57) ABSTRACT

A white light emitting diode (LED) is provided, which includes a reflective mirror arranged on the light emitting path of a blue or an ultra violet LED die at an appropriate angle. Phosphors are coated on the reflective mirror, the emitting plane of the LED, or both so that the phosphors are excited by the blue or UV lights emitted by the LED die to produce white lights. The present invention provides a white LED having a long lifetime and a uniform light color by separating the phosphors from the LED die, and by allowing the lights emitted from the LED die to undergo several excitations with the phosphors.

18 Claims, 5 Drawing Sheets

WHITE LIGHT EMITTING DIODE USING PHOSPHOR EXCITATION

BACKGROUND OF THE INVENTION

1. Field of the Invention

The invention generally relates to white light emitting diodes, and more particularly to a white light emitting diode using phosphor excitation with the phosphor separated from the die.

2. The Prior Arts

One of the more common and mature white light emitting diode (LED) technologies is to coat or fill a yellow phosphor on or around a blue LED die. The yellow phosphor is excited by radiation from the blue LED and emits yellow lights. The blue lights emitted by the LED are then mixed with the complimentary yellow lights from the phosphor to generate two-wavelength white lights. However, with this technique, it is difficult to control the proportions of the participated blue and yellow lights and, as a result; the generated white lights usually have a non-uniform light color, too high a color temperature, and too low a color rendering index.

In another similar technology, red, green, and blue (RGB) phosphors are coated or filled around an ultra-violet (UV) LED. The phosphors are excited by the UV lights emitted from the UV LED, and the generated RGB lights are combined to form white lights. However, this technique still suffers the difficultly in controlling the proportions of RGB phosphors, although the UV lights themselves do not participate in forming the white lights. As a result, the color uniformity, color temperature, and color rendering problems are not satisfactorily resolved.

The foregoing techniques have another disadvantage. The phosphors coated on or filled around the LED die would be deteriorated due to the heat generated from the LED die itself, which would further compromise the performances of the LED including its color, brightness, and lifetime.

To solve the problem of uniformity, several solutions have already been disclosed. For example, U.S. Pat. Nos. 5,962,971 and 5,813,753 disclose that a filter was included in the LED package to improve the uniformity of the mixed white light. Taiwan Patent No. 569,479 discloses that a blue LED or an UV LED die was arranged in a fluorescent glue, and interposed between dielectric omni-directional reflectors so that the blue lights or UV lights are reflected repeatedly in all directions to excite the phosphors as much as possible, thereby consuming the energy of blue lights or UV lights and enhancing the white light conversion efficiency. However, the above-mentioned techniques could still not solve the phosphors' deterioration problem from direct contact with the LED die. Furthermore, the arrangement of the filter or the reflectors would also add to the process complexity, resulting in high manufacturing cost and low yield.

In view of the phosphor deterioration problem, Taiwan Patent No. M246,528 provides a white LED lamp, which can prevent the phosphors from heat deterioration by separating the phosphors from the LED die. However, this technique is designed for a lamp including many blue LEDs, but not for an individual LED.

SUMMARY OF THE INVENTION

A main objective of the present invention is to provide a white LED, which separates the excitable entities (i.e. phosphors) from the light source (i.e. a blue or a UV LED die) so that the phosphors do not directly contact with the LED die to avoid the heat deterioration problem, thereby increasing the lifetime of the white LED of the present invention.

Another main objective of the present invention is to provide a white LED, which utilizes a simple reflective structure through which the phosphors could be excited more than once by the blue lights or UV lights emitted from the blue or UV LED die, thereby increasing their reaction. As a result, the white light uniformity, color temperature, and color rendering problems of the LED could be effectively resolved.

To achieve the foregoing objectives, the present invention provides a reflective mirror arranged on the light emitting path of the blue or the UV LED die at an appropriate inclined angle, which could reflect and redirect the blue lights or UV lights to be emitted out from an emitting plane of the LED. The phosphors are coated on the reflective mirror, the emitting plane of the LED, or both so as to achieve the separation of the phosphors and the LED die. In addition, if the phosphors are coated on both the reflective mirror and the emitting plane, the phosphor coated on the reflective mirror is firstly excited by the blue lights or UV lights emitted by the die to generate white lights, and the white lights together with the remaining blue lights or UV lights whose energy is not yet consumed are reflected by the reflective mirror toward the emitting plane. These remaining blue lights or UV lights get a second chance to react with the phosphors coated on the emitting plane. As a result, a uniform light color, a low color temperature, and a good color rendering index could be achieved.

A more complete appreciation of the invention and many of the attendant advantages thereof will be readily attained as the same becomes better understood by reference to the following detailed description when considered in connection with the accompanying drawings. However, it is understood that these embodiments with the accompanying drawings are intended only as illustrative examples and the invention is not to be limited thereto. The invention is intended to be limited only by the scope of the appended claims.

DETAILED DESCRIPTION OF THE INVENTION

Figure 1A:
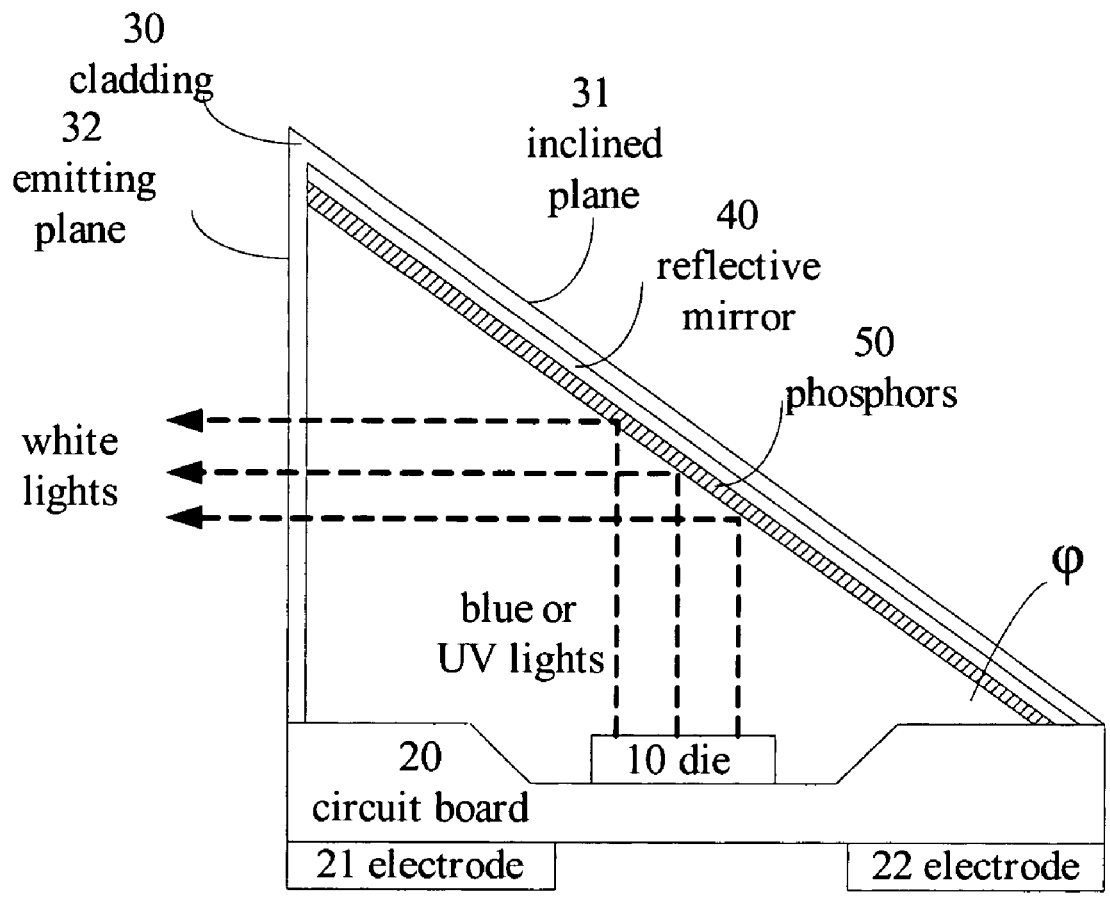
FIGS. 1a and 1b show a cross sectional side view, and a front view of the white LED according to the first embodiment of the present invention, respectively.
Figure 1B:
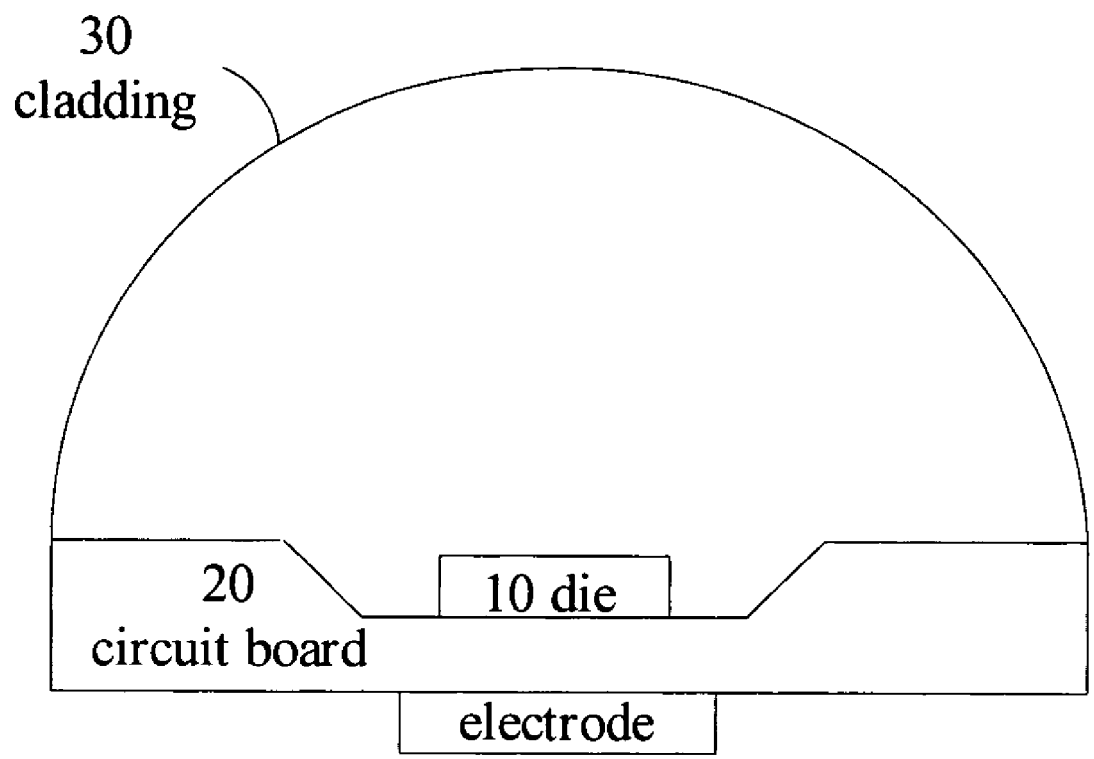

FIGS. 1a and 1b show a cross sectional side view, and a front view of the white LED according to the first embodiment of the present invention, respectively. As shown in FIG. 1a and FIG. 1b, a conventional blue or UV LED die 10 is arranged on a circuit board 20 having a positive electrode 21 and a negative electrode 22. The LED die 10 is driven to emit blue lights or UV lights when an external voltage is applied onto the positive electrode 21 and the negative electrode 22.

A conventional LED is usually encapsulated in a transparent, cylindrical bell cladding made of epoxy to protect the LED die 10 and the circuit board 20 therein. Meanwhile, the bell cladding also provides light convergence similar to a convex lens. Instead of using a bell cladding, a cylindrical cladding 30 having an inclined plane 31 on the top, as if it is obtained from cutting a right cylinder in half at an inclined angle, is used in this embodiment. The included angle φ between the inclined plane 31 and the circuit board 20 is set between 15° and 75°, preferably between 30° and 60°. It is noted that the bottom edge of the inclined plane 31 is intersecting the upper surface of the circuit board 20, as shown in FIG. 1a. However, the bottom edge of the inclined plane 31 could be arranged at an appropriate distance from the upper surface of the circuit board 20 in another embodiment.

A metal film made from gold (Au), aluminum (Al), nickel (Ni), titanium (Ti), or chromium (Cr) is formed on the inner surface of the inclined plane 31 by electroplating or other processes such as sputtering, chemical vapor deposition, etc., which functions as a reflective mirror 40. In another embodiment, the reflective mirror 40 could also be a Bragg reflector made from dielectric materials. The metal film reflective mirror or the Bragg reflector is well known technique to those skilled in the related art.

It is particularly pointed out that the inclined plane 31 of the epoxy cladding 30 provides the place for the configuration of the reflective mirror 40 in the present invention. The advantage of doing so is that the structure is simple. However, in another embodiment of the present invention, the reflective mirror 40 could be configured at different places inside the epoxy cladding 30, and the shape of the epoxy cladding 30 is not limited to the one used by the present embodiment.

The phosphors 50 are coated on the reflective mirror 40, and the phosphors 50 are selected such that they could be excited to produce complementary lights to those emitted from the LED die 10 to form white light. For example, if the LED die 10 is a blue LED die, the phosphors 50 are YAG (yttrium aluminum garnet)-based yellow phosphors. If the LED die 10 is an UV LED die, the phosphors 50 are RGB tricolor phosphors made from europium-doped barium aluminum oxide. As to the coating of the phosphors 50, any suitable conventional process can be used, such as spin coating, sputtering, and printing.

After an appropriate voltage is applied onto the electrodes 21 and 22, the LED die 10 emits blue lights or UV lights proceeding toward the reflective mirror 40. It is noted that the sum of the incident angle for the blue lights or UV lights to the reflective mirror 40 and the included angle φ is 90°. The reflective mirror 40 is arranged so that the incident angle of the blue lights or UV lights is set between 15° and 75°, preferably between 30° and 60°. The phosphors 50 coated on the surface of the reflective mirror 40 are excited by the blue lights or UV lights and the produced lights are mixed with the blue lights or UV lights to form white lights. Subsequently, the generated white lights are reflected by the reflective mirror 40 and proceed toward the emitting plane 32.

In this embodiment, the emitting plane 32 is a convex plane which provides a convergence effect similar to a convex lens because the epoxy cladding 30 has a cylindrical shape. In another embodiment, the epoxy cladding 30 could be a cylinder having semicircle cross section, and the emitting plane 32 would be a planar plane. In other words, the geometry of the emitting plane 32 of the present invention is not limited to a specific shape.

Figure 1C:
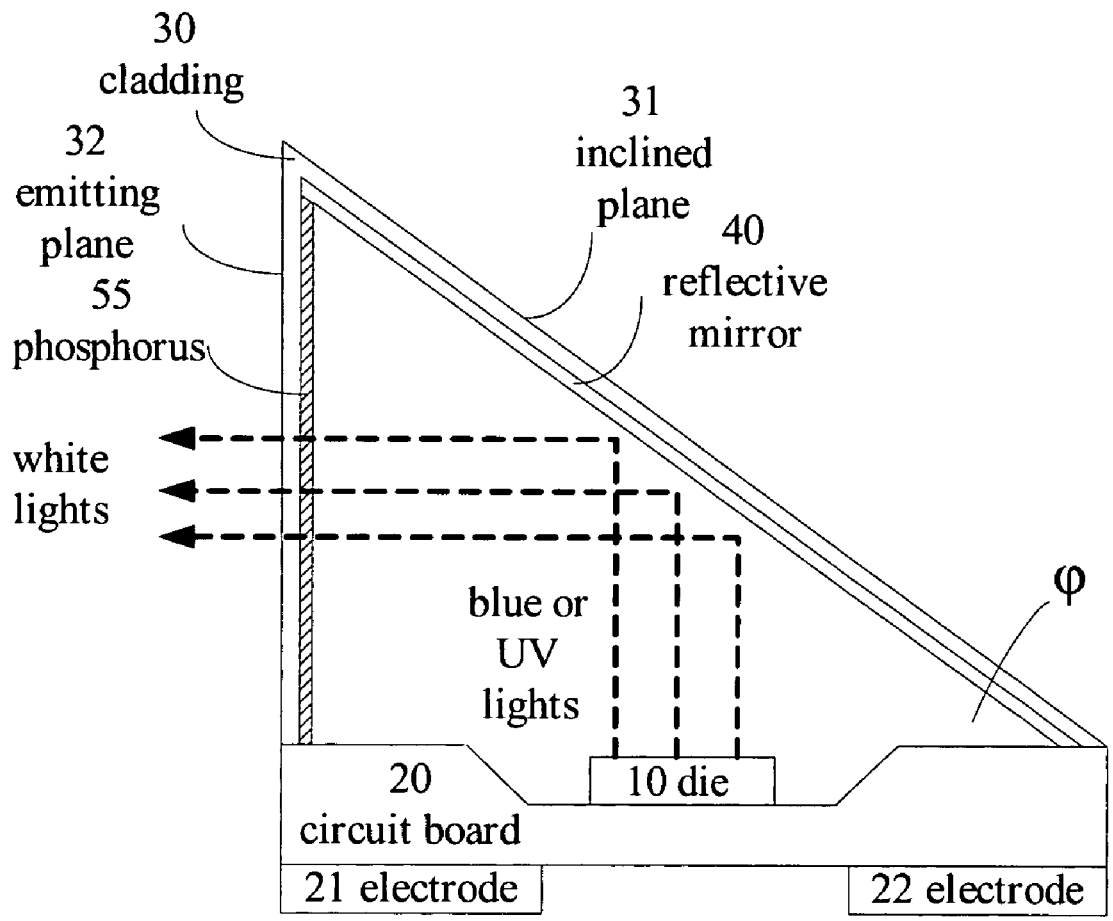
FIG. 1c shows a cross sectional side view of the white LED according to the second embodiment of the present invention.

In this embodiment, a simple reflective structure in which the phosphors and the LED die are separately arranged, thereby preventing the phosphors from heat deterioration and avoiding the problem of reduced lifetime of the LED. Based on the same concept, in another embodiment, the phosphors are coated on the inner surface of the emitting plane 32, but not on the reflective mirror 40, as shown in FIG. 1c. Similarly, the phosphors 55 coated on the inner surface of the emitting plane 32 would produce complimentary lights when excited to the radiation of the LED die 10. In the second embodiment, the blue lights or UV lights emitted by the LED die 10 proceeds toward the emitting plane 32 after being reflected by the reflective mirror 40. The phosphor 55 is then excited by the reflected blue lights or UV lights, and the produced lights are mixed with the blue lights or UV lights to form white lights. The generated white lights then emits through the emitting plane 32.

Figure 1D:
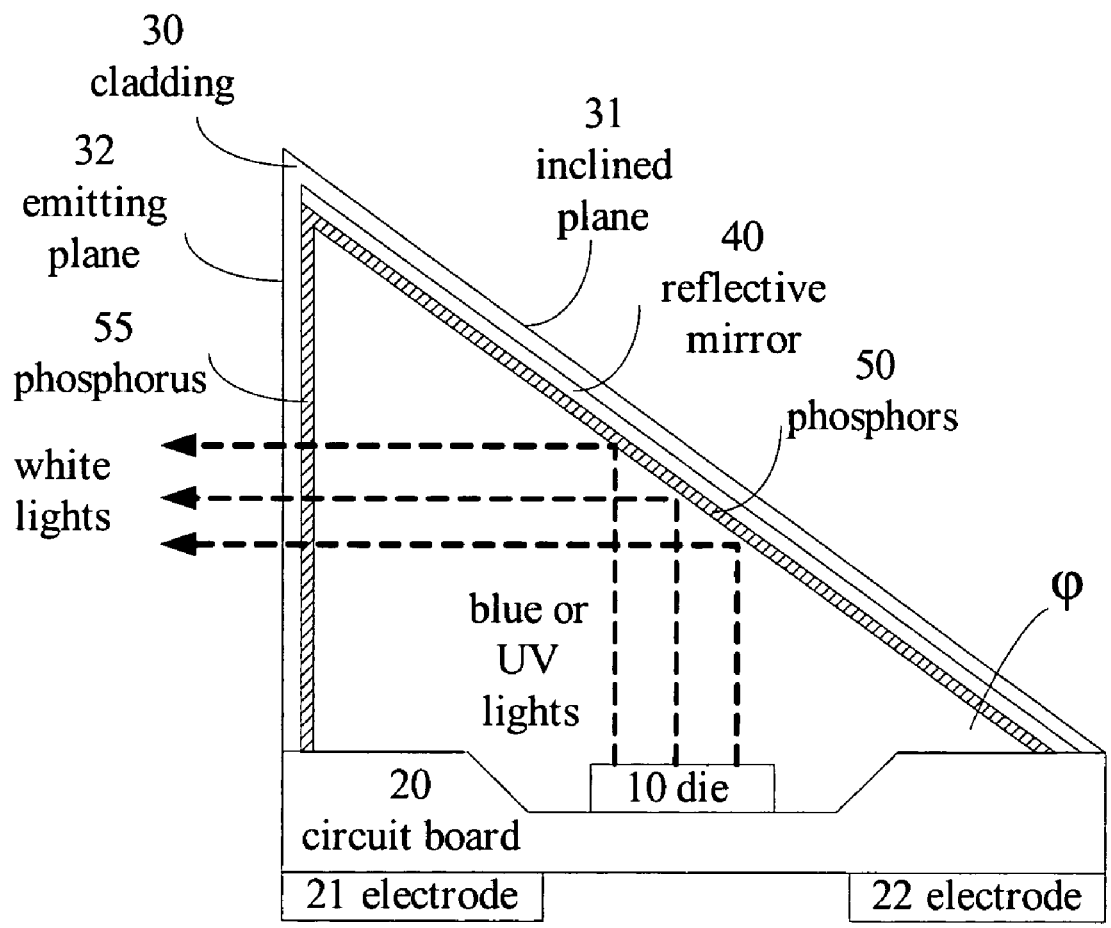
FIG. 1d shows a cross sectional side view of the white LED according to the third embodiment of the present invention.

In the foregoing first and second embodiments, the generated white lights may still include blue lights or UV lights whose energy is not consumed completely. In order to further improve the uniformity of light color, a third embodiment that combines the first embodiment with the second embodiment is provided, as shown in FIG. 1d. In the third embodiment, the phosphors 50 and 55 are coated on the inner surfaces of the reflective mirror 40 and the emitting plane 32, respectively. The phosphor 55 coated on the emitting plane 32 can be of the same or different material from the phosphor 50 coated on the reflective mirror 40. The main point of the third embodiment is that the blue lights or UV lights whose energy is not consumed after reacting with the phosphor 50 could react with the phosphor 55, which therefore improves the uniformity of the white lights and solves the problem of high color temperature. In addition, regardless of the shape of the emitting plane 32, it is important that the emitting plane 32 is perpendicular (or is very close to perpendicular) to the lights (white lights, blue lights, or UV lights) reflected by the reflective mirror 40 so that they can fully react with the phosphor 55.

In summary, a simple reflective structure is adopted in the third embodiment so that the blue light or the UV light emitted by the LED die could react with the phosphors twice. As a result, the generated white lights are more uniform, and the problems of the color temperature and the color rendering could be avoided. On the other hand, the present invention can provide two or more reflective mirrors, part of or all of which are coated with phosphors, and the phosphors can be excited twice or more times by the reflections of these reflective mirrors.

Figure 2:
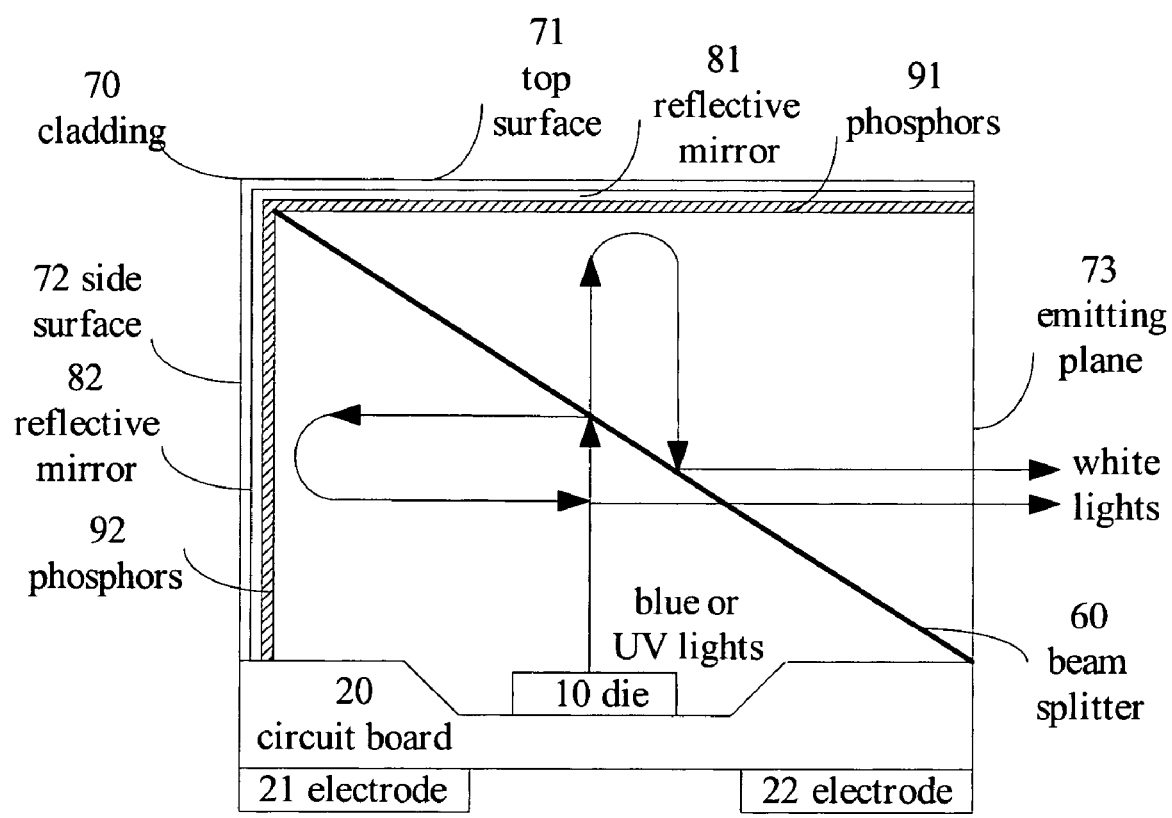
FIG. 2 shows a cross sectional side view of the white LED according to the fourth embodiment of the present invention.

According to the same concepts in the above embodiments, the fourth embodiment is illustrated in FIG. 2. A beam splitter 60 is arranged on the light emitting path of the LED die 10 at an inclined angle which is similar to that of the reflective mirror 40 in the above embodiments. A beam splitter 60 transmits part of the blue lights or the UV lights emitted by the LED die 10, and reflects the rest.

In the fourth embodiment, the epoxy cladding 70 could have a cylindrical shape or a cubic shape. The reflective mirrors 81 and 82 could be arranged on the top surface 71 and the side surface 72 of the epoxy cladding 70, respectively. The reflective mirrors 81 and 82 work the same way as the reflective mirror 40. In addition, the phosphors 91 and 92 are respectively coated on the reflective mirrors 81 and 82, wherein the phosphors 91 or 92 can produce complimentary lights to the radiation of the LED die 10. The materials or the coating method of the phosphors 91 and 92 can be identical or different.

The phosphor 91 coated on the top surface 71 of the reflective mirror 81 would be excited by part of the blue lights or the UV lights passing through the beam splitter 60. Subsequently, the generated white lights are reflected by the reflective mirror 81 and the beam splitter 60, and proceeds toward the emitting plane 73. In the same manner, the phosphor 92 coated on the side surface 72 of the reflective mirror 82 would be excited by part of the blue lights or the UV lights reflected by the beam splitter 60. Furthermore, the generated white lights are reflected by the reflective mirror 82, and then pass through the beam splitter 60, and proceeds toward the emitting plane 73.

In the third embodiment, the phosphors are excited twice by the blue lights or the UV lights. However, in the fourth embodiment, the blue light or the UV light is split into two parts, each of which reacts with the phosphor once. The objectives of these two embodiments are to increase the reaction areas and reaction times between the blue lights or the UV lights and the phosphors in order to enhance the uniformity of the white lights. In the fourth embodiment, the phosphors could be excited twice as well, as illustrated in the third embodiment. In this case, the emitting plane 73 could be coated with phosphors to generate better white lights.

It will be apparent to those skilled in the art that various modifications and variations can be made in the present invention without departing from the spirit or scope of the invention. Thus, it is intended that the present invention cover the modifications and the variations of this invention provided they come within the scope of the appended claims and their equivalents.

What is claimed is:

1. A white light emitting diode using phosphor excitation, comprising:
    a circuit board having a positive electrode, a negative electrode, and a light emitting diode die, the light emitting diode die being driven to emit specific color lights when an external voltage is applied onto the positive electrode and the negative electrode;
    a reflective mirror arranged on an emitting path of the specific lights emitted by the light emitting diode die at an appropriate inclined angle, first phosphors being coated on an incident plane of the reflective mirror, the first phosphors configured so that white lights are produced by the specific lights' exciting the first phosphors; and
    a cladding encapsulating the circuit board and the reflective mirror therein, lights reflected by the reflective mirror emitting out of the white light emitting diode through a emitting plane of the cladding,
    wherein the light emitting diode emits the specific lights to the reflective mirror on the emitting path, and the first phosphors coated on the incident plane of the reflective mirror are excited by the specific lights to generate white lights, and the white lights are reflected by the reflective mirror and then emit through the emitting plane of the cladding.

2. The white light emitting diode using phosphor excitation as claimed in claim 1, wherein the light emitting diode die is one of a blue light emitting diode die and an UV light emitting diode die.

3. The white light emitting diode using phosphor excitation as claimed in claim 1, wherein the appropriate inclined angle of the reflective mirror is set so that an incident angle of the specific lights are between 15° and 75°.

4. The white light emitting diode using phosphor excitation as claimed in claim 1, wherein the reflective mirror is one of a metal film reflective mirror coated with a metallic material and a Bragg reflector made from a dielectric material.

5. The white light emitting diode using phosphor excitation as claimed in claim 4, wherein the metal material is selected from the group consisting of gold (Au), aluminum (Al), nickel (Ni), titanium (Ti), and chromium (Cr).

6. The white light emitting diode using phosphor excitation as claimed in claim 1, wherein an inner surface of the emitting plane is coated with second phosphors, and the second phosphors are configured so that white lights are produced by the specific lights' exciting the second phosphors.

7. A white light emitting diode using phosphor excitation, comprising:
    a circuit board having a positive electrode, a negative electrode, and a light emitting diode die, the light emitting diode die being driven to emit specific lights when an external voltage is applied onto the positive electrode and the negative electrode;
    a reflective mirror arranged on an emitting path of the specific lights emitted by the light emitting diode die at an appropriate inclined angle; and
    a cladding encapsulating the circuit board and the reflective mirror therein, lights reflected by the reflective mirror emitting out of the white light emitting diode through a emitting plane of the cladding, an inner surface of the emitting plane being coated with first phosphors, the first phosphors configured so that white lights are produced by the specific lights' exciting the first phosphors,
    wherein the light emitting diode emits the specific lights to the reflective mirror on the emitting path, and then to the emitting plane when reflected by the reflective mirror, and the first phosphors coated on the inner surface of the emitting plan is excited to generate white lights, and the white lights emits through the emitting plane of the cladding.

8. The white light emitting diode using phosphor excitation as claimed in claim 7, wherein the light emitting diode die is one of a blue light emitting diode die and an UV light emitting diode die.

9. The white light emitting diode using phosphor excitation as claimed in claim 7, wherein the appropriate inclined angle of the reflective mirror is set so that an incident angle of the specific lights is between 15° and 75°.

10. The white light emitting diode using phosphor excitation as claimed in claim 7, wherein the reflective mirror is one of a metal film reflective mirror coated with a metal material and a Bragg reflector made from a dielectric material.

11. The white light emitting diode using phosphor excitation as claimed in claim 10, wherein the metal material is selected from the group consisting of gold (Au), aluminum (Al), nickel (Ni), titanium (Ti), and chromium (Cr).

12. The white light emitting diode using phosphor excitation as claimed in claim 7, wherein an incident plane of the reflective mirror is coated with second phosphors, and the second phosphors are configured so that white lights are produced by the specific lights' exciting the second phosphors.

13. A white light emitting diode using phosphor excitation, comprising:
    a circuit board having a positive electrode, a negative electrode, and a light emitting diode die, the light emitting diode die being driven to emit a specific light when an external voltage is applied onto the positive electrode and the negative electrode;

a first reflective mirror having an incident plane coated with first phosphors, the first phosphors configured so that white lights are produced by the specific lights' exciting the first phosphors;

a second reflective mirror having an incident plane coated with second phosphors, the second phosphors configured so that white lights are produced by the specific lights' exciting the second phosphors;

a beam splitter arranged on an emitting path of the specific lights emitted by the light emitting diode die at an appropriate inclined angle, the beam splitter allowing part of the specific lights on the emitting path to pass through and proceed toward the first reflective mirror and reflecting part of the specific lights toward the second reflective mirror; and a cladding encapsulating the circuit board and the reflective mirrors therein, lights reflected by the reflective mirrors emitting out of the white light emitting diode through an emitting plane of the cladding, wherein the first phosphors coated on the incident plane of the first reflective mirror is excited by the specific lights falling on the first reflective mirror to generate white lights, and the white lights emits through the emitting plane of the cladding after reflected by the first reflective mirror and the beam splitter; and the second phosphors coated on the incident plane of the second reflective mirror is excited by the specific lights falling on the second reflective mirror to generate white lights, and the white lights emit through the emitting plane of the cladding after reflected by the second reflective mirror and passing through the beam splitter.

14. The white light emitting diode using phosphor excitation as claimed in claim 13, wherein the light emitting diode die is one of a blue light emitting diode die and an UV light emitting diode die.

15. The white light emitting diode using phosphor excitation as claimed in claim 13, wherein the first reflective mirror is one of a metal film reflective mirror coated with a metal material and a Bragg reflector made from a dielectric material.

16. The white light emitting diode using phosphor excitation as claimed in claim 13, wherein the second reflective mirror is one of a metal film reflective mirror coated with a metal material and a Bragg reflector made from a dielectric material.

17. The white light emitting diode using phosphor excitation as claimed in claim 16, wherein the metal material is selected from the group consisting of gold (Au), aluminum (Al), nickel (Ni), titanium (Ti), and chromium (Cr).

18. The white light emitting diode using phosphor excitation as claimed in claim 13, wherein the emitting plane is coated with third phosphors, and the third phosphors are configured so that white lights are produced by the specific lights' exciting the first phosphors.

* * * * *